United States Patent [19]

Whartenby et al.

[11] 4,445,978

[45] May 1, 1984

[54] METHOD FOR FABRICATING VIA CONNECTORS THROUGH SEMICONDUCTOR WAFERS

[75] Inventors: James C. Whartenby, Trenton; Richard Brown, Berkeley Heights; Srinivas T. Rao, Kendall Park, all of N.J.; Raymond J. Menna, Jenkintown, Pa.

[73] Assignee: RCA Corporation, New York, N.Y.

[21] Appl. No.: 473,551

[22] Filed: Mar. 9, 1983

[51] Int. Cl.³ .......................... C25D 5/02; C25D 7/04
[52] U.S. Cl. ...................................... 204/15; 204/24; 204/273
[58] Field of Search .................... 204/15, 24, 273, 26

[56] References Cited

U.S. PATENT DOCUMENTS

| | | | |
|---|---|---|---|
| 3,562,009 | 2/1971 | Cranston et al. | 117/227 |
| 3,986,196 | 10/1976 | Decker et al. | 357/22 |
| 4,135,988 | 1/1979 | Dugan et al. | 204/15 |
| 4,258,468 | 3/1981 | Balde | 29/830 |
| 4,348,253 | 9/1982 | Subbarao et al. | 156/643 |
| 4,368,106 | 1/1983 | Anthony | 204/15 |

Primary Examiner—T. M. Tufariello
Attorney, Agent, or Firm—Birgit E. Morris; Edward J. Sites

[57] ABSTRACT

A method is provided for fabricating a via connector from a first surface of a semiconductor wafer to an opposite second surface of the wafer. The first step consists of forming an adherent metal layer on the first surface on the semiconductor wafer. If the first surface of the semiconductor wafer has electronic components formed thereon, the metal layer is applied over the electronic components and preferably a protective layer of material is formed over the metal layer. Via holes are then laser drilled at predetermined locations through the metal layer and then through the semiconductor wafer. Thereafter a photoresist layer is applied over the first surface and exposed and developed to provide passage holes in the photoresist which are in alignment with the laser drilled apertures. The metal layer is then connected in the cathode position of the electroforming apparatus and via connectors are thereafter electroformed in the via holes.

10 Claims, 10 Drawing Figures

METHOD FOR FABRICATING VIA CONNECTORS THROUGH SEMICONDUCTOR WAFERS

The United States Government has rights in this invention pursuant to contract No. N 00014-79-C-0568 awarded by the Department of the Navy.

This invention relates to an improved method for fabricating via connectors in semiconductor wafers and more particularly is concerned with providing a method for consistently forming via connectors of the small dimensions and uniform low resistivity required for semiconductor devices.

BACKGROUND OF THE INVENTION

Via connectors are widely used in the electronic industry for making electrical connections between the opposite surfaces of electronic devices. For example, in the manufacture of printed circuit board assemblies it is common practice to place discrete electronic components on one surface of a printed circuit board and to form the required connecting circuitry, ground planes, or the like on the opposite surface with the required electrical connections being made through the printed circuit board by using plated through holes or by various other techniques well known to those skilled in the printed circuit board art.

In the fabrication of semiconductor devices, it is also often desirable to form solid state electronic component on one surface of the semiconductor wafer of the device, connecting circuitry, ground planes and the like on the opposite surface of the semiconductor wafer and then to provide electrical connections between the elements on the two surfaces. For example, in the manufacture of microwave devices, it is often desirable to form a field effect transistor or a diode on one surface of a semiconductor wafer, a microstrip, heat sink, ground plane, or the like, on the opposite surfaces of the wafer and then to provide the required electrical connection between the surfaces with a via connector.

The problems of making the required via connectors in semiconductor devices are substantially more difficult than that of forming of plated through holes or the like in printed circuit board assemblies. One of the principle reasons for the increased difficulty in forming via connectors in semiconductor devices is that the applicable design rules used for semiconductor devices require substantially smaller dimensions. The printed circuit board typically used in the electronic art are generally between an ⅛" (0.3175 cm) and a ¼" (0.635 cm) in thickness. Printed circuit boards are also generally relatively large in surface area with boards 8" (20.32 cm) by 10" (24.54 cm) being relatively commonly used with often much larger size boards being utilized for example in television sets and the like. Because of the relatively large size of printed circuit board assemblies and the considerable space between the discrete electronic element of the printed circuit board assemblies, the apertures made through the printed circuit board can be relatively large, with typically the diameter of the via holes being about 1/16" (0.159 cm) to ⅛" (0.3175 cm) in diameter or larger. Because of the relatively large size of the apertures which can be formed in printed circuit boards, it is relatively simple to form the required via connectors in the printed circuit boards. By way of comparison, semiconductor devices are, for an equivalent type of electronic devices, orders of magnitude smaller than that of the printed circuit board assemblies.

For these reasons, the applicable design rules for semiconductor devices restrict the amount of area on the surface of the wafer which can be utilized for via connectors. While there is no stated size limitation with regard to the diameter of the via conductors for semiconductor devices they are typically only about 1 mil (0.00254 cm) in diameter in order not to consume excessive amounts of the surface area of the semiconductor device. The small diameter of the via connectors required for semiconductor devices makes it extremely difficult to consistently form satisfactorily via connectors. The problems of the small via hole diameter is further complicated by the fact that the wafer through which the via connector must be formed is typically, for example, 10 mils (0.0254 cm) in thickness so the via connector is required to be formed with a length to diameter aspect ratio of 10 to 1. This high aspect ratio makes it considerably more difficult to form a continuous low resistance via connector as compared to the 1 to 1 or 2 to 1 length to diameter ratios typically encountered when forming via connectors in printed circuit boards.

Various methods have heretofore been suggested for forming via connectors in semiconductor devices. One such method is disclosed in Decker et al. in U.S. Pat. No. 3,986,196—THROUGH SUBSTRATE SOURCE CONTACTS FOR MICROWAVE FET. In the method disclosed by Decker et al., various electronic components are initially formed on one surface of a semiconductor wafer. Thereafter, the opposite surface of the wafer is coated with a photoresist, exposed and developed to provide an etchant mask with holes defined therein which should be aligned with the circuit components on the opposite side of the semiconductor wafer. Thereafter, an etchant is used to form via holes through the wafer. Metallization is then applied to form the desired via connectors. Chemical etching processes such as those disclosed in Decker et al., have not, however, proven to be completely satisfactory. Considerable problems are encountered in precisely aligning the holes formed in the photoresist so that during exposure and development, the holes will be in alignment with electronic components on the opposite side of the wafer. Furthermore, the chemical etching of the via apertures causes significant undercutting of the wafer material. The extent of undercutting that is encountered is typically proportional to the depth of the etch hole so that, for example, when attempting to etch a 1 mil hole in a 4 mil wafer, it is not uncommon to have 4 or 5 mils of undercutting in the wafer. A further problem that is encountered with chemcial etching is if there are a plurality of holes etched in the wafer, the etching is typically not uniform so that the resulting holes will vary substantially in size.

In order to overcome the problems encountered with the chemical etching processes, it was suggested to laser drill the via holes in the wafer. It was found, however, that in practice with certain types of wafers, particularly those having circuit components formed on one surface of the semiconductor wafer, that the laser drilling caused considerable damage to the surface of the wafers, and particularly to the electronic components formed on the surface.

In Subbarao et al. U.S. Pat. No. 4,348,253—METHOD FOR FABRICATING VIA HOLES IN A SEMICONDUCTOR WAFER there is disclosed an improved method for forming via connectors using laser drilling. Subbarao et al. uses a process wherein a layer of a photoresist is applied on the surface of a semiconductor wafer on which a layer of electronic components is formed. The layer of photoresist is then patterned so as to have apertures defined in the photoresist where the via holes are to be laser drilled. The via holes are then drilled through the wafer and the layer of photoresist is used in the process to protect electronic components formed on the surface of the wafer. Subbarao et al. then discloses depositing a metallic layer on the side of the wafer opposite the one on which the electronic components are formed. The wafer is then secured to an adhesive non-porous dielectric layer of material which in turn is secured to the cathode plate of electroforming apparatus in such a manner that the laser drilled holes drilled in the semiconductor device are in effect dead ended. Then, according to Subbarao et al., an electrical connection is then made between the cathode plate and the deposited metal layer on the surface opposite the surface with the electronic components using a material such as silver paste or the like. The entire assembly is subjected to the electroforming which results in the formation of via connectors in the laser drilled via holes.

The method disclosed by Subbarao et al. was found to be a substantial improvement in the art with regard to forming via connectors in semiconductor devices. However, the Subbarao et al. process was still found to have certain serious disadvantages. The main problem with that the control of the process conditions was highly critical in that if the current density or other process parameters exceeded critical amounts, the via holes would then tend to plate over the exposed ends of the via holes before the via connectors were completely formed. The discontinuities in the electroforming resulted in voids in the via connectors which then caused opens or high resistence via connectors.

What would be highly desirable would be a method for forming via connectors in semiconductor wafers which would be both simple to perform and which would consistently produce via connectors of a uniform low resistivity.

SUMMARY OF THE INVENTION

A method is provided for fabricating a via connector from a first surface of a semiconductor wafer to an opposite second surface of the wafer. The first step consists of forming an adherent metal layer on the first surface on the semiconductor wafer. If the first surface of the semiconductor wafer has electronic components formed thereon, the metal layer is applied over the electronic components and preferably a protective layer of material is then formed over the metal layer. Via holes are then laser drilled at predetermined locations through the metal layer and then through to the opposite surface of the semiconductor wafer. Thereafter a resist layer is applied over the first surface and exposed and developed to provide passage holes in the layer of photoresist which are in alignment with the laser drilled apertures. The metal layer is then connected in the cathode position of the electroforming apparatus and via connectors are thereafter electroformed in the via holes.

DETAILED DESCRIPTION OF THE INVENTION

Figure 1:
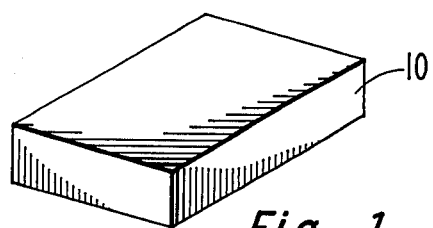
FIG. 1 is a isometric illustration of a plain semiconductor wafer.
Figure 2:
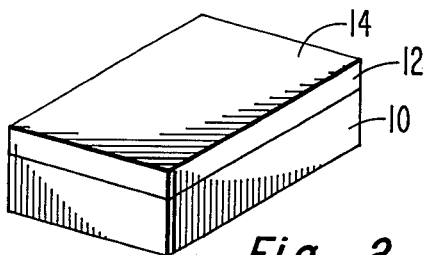
FIG. 2 is an isometric illustration of a semiconductor wafer having a layer comprised of electronic components formed on a first surface thereof.
Figure 3:
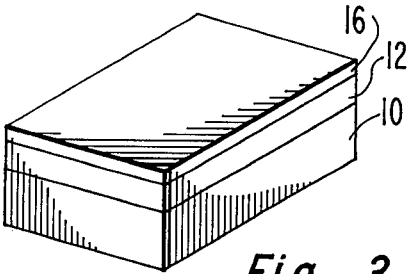
FIG. 3 is an isometric illustrating the semiconductor wafer of FIG. 2 having formed over the layer of electronic components a continuous layer of metallic material.
Figure 4:
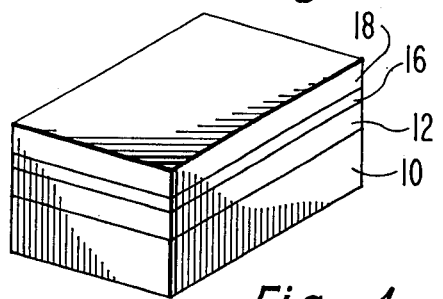
FIG. 4 is an isometric illustration of the wafer of FIG. 2 having a protective layer formed over the metallic layer.
Figure 5:
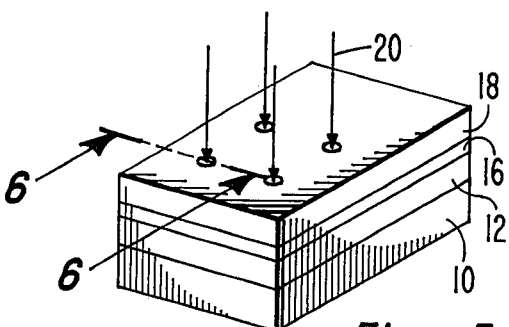
FIG. 5 is a prespective illustration of the wafer assembly of FIG. 4 which is schematically illustrated being laser drilled.

The semiconductor wafers through which the via connectors are fabricated can be comprised of various well known semiconductive materials such as silicon and gallium arsenide. The semiconductive materials must be passive under the electroforming conditions used in the method of this invention, that is, the semiconductive materials in their untreated state must not accept electrodeposited metal during electroforming of the via connectors. The wafers can be of various thicknesses with wafers having a thickness of between 4 mils (0.01 cm) and 10 mils (0.0254 cm) being well suited for use in the method of this invention.

The semiconductor wafers 10, which are treated in accordance with this invention can be plain, that is wafers which do not have electronic components formed on either of the surfaces of the wafer. More preferably, however, the wafer 10 should include an electronic component layer 12 on a first surface 14 of the wafer 10. The presence of the electronic component layer 12 both facilitates the required alignment of the via holes with the electronic components and also the overall manufacture of the complete electronic device. It should be noted that for purposes of facilitating the description of the present invention, the electronic components (not shown) which typically are comprised of a plurality of layers is illustrated as a single layer 12.

The initial step in the present method is to form a metallic layer 16 on the first surface 14 of the wafer 10. In the case of a wafer having a layer of electronic components formed thereon, the metallic layer 16 is formed over the exposed surface 14 of the layer of electronic components 12. The metallic layer 16 can be comprised of various metals with metals having high electrical conductivity properties being most preferred. The metal layer 16 should also be selected so as to be of a type which will form an adherent bond with the exposed first surface 14 of the wafer 10. The metallic layer 16 can be made of a sinqle metal or can be formed from an alloy of various metals can also likewise be comprised of a plurality of integral layers of different metals. For example, a preferred metallic layer 16 for use in the method of this invention has been found to be the trimetallic layer formed by depositing a layer of titanium directly on the first surface 14 then depositing a layer of platinum over the titanium and then a depositing layer of gold over the platinum layer. The metallic layer 16 can be applied by methods which are conventional in the art such as sputtering, chemical vapor deposition or the like. The thickness of the metal layer is somewhat dependent upon the electrical conductive properties of the metal or metals used to form the metallic layer with thicknesses of between 50 and 500 angstroms generally being quite satisfactory for the purposes of this invention.

The wafer 10 having the metal layer 16 on the surface thereof can then be laser drilled to provide the via holes 22 through the wafer. However, in the preferred method of this invention, especially when a layer of an electronic component 12 is formed on the wafer 10, a protective layer 18 of a second material such as a photoresist is applied over the metallic layer 16. The protective layer 18 is used to prevent surface damage of the first surface 14 caused by the laser blast damage and the debris created by the laser drilling.

Because of its function, it is important that the protective layer 18 be of sufficient thickness to prevent physical damage to the surface 14 of the wafer 10 being laser drilled. While various materials can be used for the protective layer, it has been found most convenient to use a photoresist of the same type which is used as the final layer as will be explained in greater detail below, in that, this facilitates the removal of both protective layer and the photoresist layer from the surface of the finished electronic device.

Figure 6:
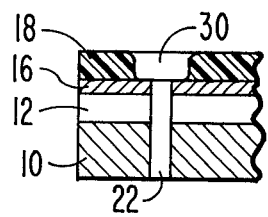
FIG. 6 is a cross-sectional illustration taken as indicated by the lines and arrows 6—6 on FIG. 5 showing the cross-section through a laser drilled aperture in the wafer assembly.

The next step in the method is to laser drill apertures at predetermined positions through the wafer. The laser drilling process may be conducted by methods well known to those well skilled in the art. For example, when the wafer is a 4 mil (0.01 cm) thick gallium arsenide material, a power setting of 20 to 30 kw with a YAG laser is suitable for drilling of a 1 mil (0.00254 cm) aperture. The laser drilling is commensed at the first surface of the treated wafer as indicated by the arrows 20 on FIG. 6. It is extremely important for the purposes of this invention that the laser drilling be conducted so that the laser beam passes through the metal layer 16 and thereafter through the wafer 10 of semiconductor material. The reason the laser beam 20 must first pass through the metal layer 16 and then through the semiconductor wafer 10 is that using the sequence of drilling disclosed in this invention, the semiconductive material which forms the interior wall of the laser drilled hole 22 are converted from being passive to being highly active so as to readily accept the electrodeposited metal used to form the via connector 24. The exact reason for this unexplained physical phenomena is not known for certain. It is believed, however, that during the laser drilling, that the metal from the metallic layer 16 is carried along by the blast stream created by the laser drilling through the aperture 22 with portions of the metal being entrapped in the fused walls of the laser drilled apertures 22. The amount of metal entrapped is sufficient amount to activate the semiconductive material on the surface of the laser drilled apertures 22. It should be noted in this regard that after laser drilling the non-laser treated surfaces such as the second surface 28 of the semiconductor wafer 16 remains passive to the electrodeposition of metal.

Figure 7:
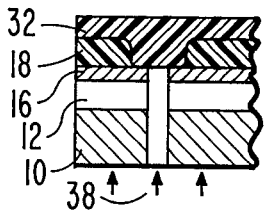
FIG. 7 is a cross-sectional illustration taken as indicated for FIG. 6 which further includes a layer of photoresist over the surface layer of the protective layer of material and which also schematically illustrates the preferred method exposing the layer of photoresist.

As shown in FIG. 7, under laser drilling conditions even when a protective layer 16 is employed a crator 30 is often opened up at the point of the laser drilling and it is even possible for a portion of the underline metal layer 16 to be exposed.

In order to assure that a precision shaped small diameter via connector is formed through the wafer without plating over of the ends of the apertures 22, it has been found that it is essential to form a layer of a photoresist 32 over the surface of the protective layer 18 and/or the metal layer 16 as the case may be. The layers of photoresist 32 will fill in the craters 30 and cover any exposed portions of the metallic layer 16.

The type of photoresist which can be employed in this invention can be either negative or positive acting. Depending upon the type of resist employed the photoresist is exposed and then developed to form holes 34 through the photoresist which are in axial alignment with the laser drilled aperture 22 in the wafer 10. In the preferred embodiment of this invention, a positive acting resist is employed which can be then exposed from the second surface 28 of the wafer 10 as indicated by the arrows 38 on FIG. 7. The wafer 10 with the laser drilled apertures thereby becomes an exposure mask for the positive resist insuring perfect axial alignment of the laser drilled aperture 22 with the developed hole 34 in the photoresist layer 26.

Figure 8:
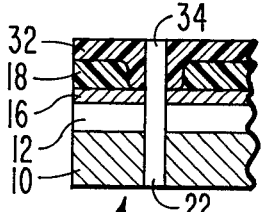
FIG. 8 is a cross-sectional illustration of the structure shown in FIG. 7 which has been developed to provide a passage through the assembly.
Figure 10:
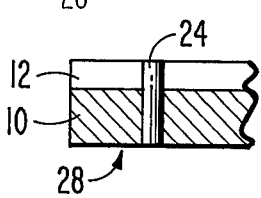
FIG. 10 is an illustration in partial cross section of a semiconductor wafer having formed therein a via conductor in accordance with the teachings of this invention.
Figure 9:
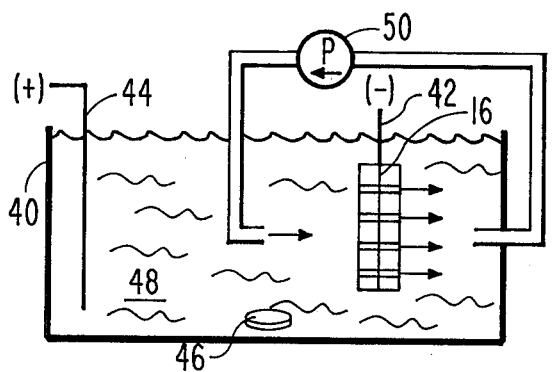
FIG. 9 is a schematic illustration of electroforming apparatus of the type suitable for forming the via holes in accordance with the teachings of the present invention.

The final step is electroforming the via connectors 24. The wafer prepared as above is placed in a suitable electroforming apparatus 40 such as that schematically illustrated in FIG. 9. The treated assembled wafer such as that shown in FIG. 8 is prepared for electroforming by removing a small portion of the photoresist layer 32 and the protective layer 16 if present from the surface of the wafer so as to expose a small edge of the metal layer 16 at a corner or the like which is sufficient to make electrical contact to the cathode plate 42 of the electroforming apparatus 40. A metal typically copper or gold is then supplied at the anode 44 of the electroforming apparatus 40. The electroforming is conducted using principles well known to those skilled in the art with the amperage being generally maintained at a low amperage per hour per square area in order to insure a slow but uniform formation of the via connectors 24 in the apertures 22 formed through the wafer 10. It is also highly advantageous to use certain techniques such as maintaining the electrolyte bath so at a somewhat elevated temperature, for example about 140° F. (60° C.) and also providing agitation as for example with a magnetic stirrer 46 or the like in order to insure a fresh supply of active electrolyte 48 flowing towards and through the wafer therein. A further technique which has been found to improve the formation of the via connectors 24 is to employ pulse plating, that is, periodically turning on the current and off the current during the electroforming of the via connector 24.

What is not generally employed in electroforming processes but which has been found to be exceptionally beneficial in the method of this invention is to provide a pump 50 for circulating electrolyte 48 through the via apertures 22 during the electroforming of the via connectors 24 in the apertures 22. The circulation of the electrolyte 48 insures that a substantial uniform flow of electrolyte 48 through the holes and a consequent uniform formation of the via connectors.

It has been noted in the electroforming process that as it commences, the walls of the via holes are initially plated insuring that at least a plated through hole connector will be obtained even if electroforming is discontinued which will provide a relative low resistance connector between the first and second surfaces of the semiconductor wafer. However, preferably the electroforming is continued until a completely formed via connector 24 is obtained. Once the via connector 24 is fully electroformed, the wafer assembly is removed from the electroforming apparatus.

The treated wafer now having the via connector 23 formed in the wafer is subjected to conventional semiconductor processing procedures wherein the layer of photoresist, the protective layer 18 and the metallic layer 16 are removed from the surface 14 of the wafer 10. In addition, the thickness of the wafer may be reduced as required for particular application and then the ground plane, circuitry or the like applied to the second surface 28 of the wafer 10 using sputtering or the like as disclosed in the prior art.

A distinct advantage of the present invention over the processes disclosed in the prior art is that using the present invention consistently satisfactorily results are obtained in making the via connectors between the first and second surfaces of the wafer. Furthermore, because of the lack of voids in the via connectors consistently lower resistance connectors are obtained which facilitates the further processing of the semiconductor devices. The results obtained by the present method have heretofore not been obtainable using the prior art method.

What is claimed is:

1. A method for fabricating a via connector in a semiconductor wafer from a first surface of the wafer and extending to a second surface of the wafer which is opposite the first surface said method comprising the ordered steps of:
   (a) forming an adherent metallic layer on the first surface of the wafer
   (b) laser drilling an aperture through said metal layer and then through the wafer from the first surface to the second surface
   (c) applying a layer of a photoresist over said metal layer
   (d) exposing and developing the photoresist provide a passage through the layer of photoresist which is in axial alignment with the aperture.
   (e) electrically connecting the metal layer to the cathode of an electroforming apparatus
   (f) immersing the wafer in an electrolyte held by the electroforming apparatus; and
   (g) electroforming a metallic via connector within said aperture extending from the first surface to the second surface of said wafer.

2. The method according to claim 1 wherein the first surface of the wafer includes an electronic component layer and said metal layer is formed over the electronic component layer.

3. The method according to claim 2 wherein a protective layer is formed over the metal layer prior to laser drilling said protective layer being of sufficient thickness to prevent the blast and debris created by laser drilling from damaging the electronic component pattern.

4. The method according to claim 1 wherein the metal layer is comprised of integral layers of sequentially deposited titanium, platinum and gold.

5. The method according to claim 1 wherein said photoresist is a positive photoresist and said photoresist is exposed through the second surface of the wafer whereby the wafer having a laser drilled hole defined therein acts as an exposure mask for exposing the positive photoresist.

6. The method according to claim 1 wherein the aspect ratio of the width to the length of the apertures is at least about 1 to 4.

7. The method according to claim 1 wherein the aperture is laser drilled to provide an aperture of about 1 mil (0.00254 cm).

8. The method according to claim 1 wherein the wafer is comprised of a semiconductive silicon.

9. The method according to claim 1 wherein the wafer is comprised of semiconductive gallium arsenide.

10. The method according to claim 1 wherein during electroforming of the via connector the electrolyte used in electroforming apparatus is circulated through the via apertures laser drilled in the wafer.

* * * * *